(12) United States Patent
Satoh et al.

(10) Patent No.: US 7,842,931 B2
(45) Date of Patent: Nov. 30, 2010

(54) EXTRACTION ELECTRODE MANIPULATOR

(75) Inventors: Shu Satoh, Byfield, MA (US); John Adamik, Byfield, MA (US); Manny Sieradzki, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 155 days.

(21) Appl. No.: 12/238,265

(22) Filed: Sep. 25, 2008

(65) Prior Publication Data

US 2010/0072402 A1 Mar. 25, 2010

(51) Int. Cl.
*H01J 37/08* (2006.01)
(52) U.S. Cl. ............................. 250/423 R; 250/492.21
(58) Field of Classification Search ............. 250/423 R, 250/492.21
See application file for complete search history.

(56) References Cited

U.S. PATENT DOCUMENTS

| 4,883,968 | A | * | 11/1989 | Hipple et al. ........... 250/423 R |
| 5,583,344 | A | | 12/1996 | Mizumura et al. |
| 5,920,076 | A | | 7/1999 | Burgin et al. |
| 6,501,078 | B1 | | 12/2002 | Ryding et al. |

* cited by examiner

*Primary Examiner*—Kiet T Nguyen
(74) *Attorney, Agent, or Firm*—Eschweiler & Associates, LLC

(57) ABSTRACT

An extraction electrode manipulator system, comprising an ion source, a suppression electrode and a ground electrode, wherein the two electrode are supported by coaxially arranged two water cooled support tubes. A high voltage insulator ring is located on the other end of the coaxial support tube system to act as a mechanical support of the inner tube and also as a high voltage vacuum feedthrough to prevent sputtering and coating of the insulating surface.

20 Claims, 4 Drawing Sheets

EXTRACTION ELECTRODE MANIPULATOR

FIELD OF THE INVENTION

The present invention relates generally to ion implantation systems and more specifically to a system for utilizing an extraction electrode manipulator that reduces the amount of maintenance required for the insulators within the manipulator.

BACKGROUND OF THE INVENTION

In the manufacture of semiconductor devices and other ion related products, ion implantation systems are used to impart dopant elements into semiconductor wafers, display panels, or other types of workpieces. Typical ion implantation systems or ion implanters impact a workpiece with an ion beam utilizing a known recipe or process in order to produce n-type or p-type doped regions, or to form passivation layers in the workpiece. When used for doping semiconductors, the ion implantation system injects selected ion species to produce the desired extrinsic material. Typically, dopant atoms or molecules are ionized and isolated, sometimes accelerated or decelerated, formed into a beam, and implanted into a workpiece. The dopant ions physically bombard and enter the surface of the workpiece, and subsequently come to rest below the workpiece surface in the crystalline lattice structure thereof.

Several areas within an ion implantation system are negatively biased, for example, a suppression electrode, e.g., at approximately −1 KV, is often typical in the system. These systems also include an ion source extraction electrode, at the exit of an acceleration tube (or at an entrance of a deceleration tube), or generally, anywhere where a positive potential is used. Suppression electrodes will discourage or inhibit electron movement between two areas into which the suppression electrode separates. The suppression electrodes are usually mounted on small ceramic standoffs, since its negative potential is not very high and the weight of the electrodes is usually quite small (e.g., 100 grams or less).

The suppression electrode in the source extraction area is in a very hostile environment. First, the high energy, high flux ion beam causes sputtering of electrode and aperture materials (i.e., mostly metal and carbon) to coat unshielded insulative surfaces to make the surfaces conductive or in addition, build up conductive "flakes" which can and often eventually cause problems, for example, initiating high voltage sparks. Secondly, the vacuum environment is known to be a "dirty location", often containing condensable vapor from within an ion source feed material and the vapor can "snake" through elaborate shielding structures to coat or deposit on the "hidden" insulative surface. Thirdly, related to the two reasons mentioned above, the suppression electrode has to endure frequent and high voltage sparks with large energy release (e.g., several Joules). Although typical ceramic standoffs are well protected by layer(s) of metal shields, those high voltage sparks often induce secondary sparks in the hidden insulative areas to cause sputter coating even in those hidden areas and worse case, insulators can crack because of a sudden surge current and rapid heating. Adding to all these deleterious environment factors, another fact is that the electrodes (e.g., suppression and ground electrodes) may have to be mechanically manipulated in position relative to the ion source, making the situation even more complicated.

Traditionally, a high voltage vacuum feed-through to supply a negative potential to the suppression electrode is located on a fixed flange of a manipulator assembly, although the suppression electrode itself moves with the manipulator. This arrangement not only requires a flexible wire or spring to connect the suppression feed through to the electrode, but also, the feed through itself is vulnerable to all the problems mentioned supra.

FIG. 1 illustrates a typical traditional arrangement of an extraction electrode manipulator 100 including an ion source 102 with source front plate 104 and an exit slit 106 formed in the front face of the ion source 102. The exit slit 106 allows an ion beam 108 to be extracted from the ion source 102. Insulating standoffs 110 are utilized to attach a suppression electrode 112 to a ground electrode 114 which allows the electrodes 112 and 114 to move in unison at a variable distance 118 from the ion source 102. The distance 118 is an important operational variable and has to be adjusted for the best properties of the exiting ion beam 108 according to ion beam energy, beam current density at the source slit 106 and mass of ions, all of which change from setup to setup. Also, side-to-side position 126 is adjustable to correct the angle of the exiting beam 108, which may come from misalignment of components or effect of the source magnetic field. These two motional adjustments are the function of extraction electrode manipulator 100. In this simplified mechanical extraction electrode manipulator 100 the metal bellows 120 is used to introduce the two motions, 118 and 126, in vacuum, but there are other methods of introducing motions in vacuum, like differentially pumped sliding seals.

As illustrated in FIG. 1 insulator shielding cups 116, surround the insulating standoffs 110, and a high voltage vacuum feedthrough 122 for suppression voltage of the simplified mechanical extraction electrode manipulator 100. Constant improvements have been tried on the shape and position of the insulating standoffs 110, involving different shapes, positioning and the number of layers of the shielding, but to date, the insulating standoffs 110 (i.e., suppression insulators) and suppression feedthrough 116 are still on (or near) the top list of periodical service list.

It is an object of the present invention, then to provide an improved extraction electrode manipulator by removing insulating standoffs and a high voltage vacuum feedthrough from the vicinity of ion beam, that require less maintenance and that result in fewer failures than previous manipulators.

SUMMARY OF THE INVENTION

The present invention overcomes the limitations of the prior art by providing a system for an efficient extraction electrode manipulator for an ion implantation system. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to eliminate high voltage insulating standoffs and high voltage feedthrough from close vicinity to the ion source, where their insulating property tends to deteriorate quickly because of surface coating, and move them, combine them, into one insulator far away from the dirty environment.

According to one exemplary aspect of the invention, an extraction electrode manipulator system, comprising an ion source, a suppression electrode and a ground electrode, wherein the suppression and ground electrodes are supported by two coaxially mounted water cooled support tubes at one end. One high voltage insulator ring supports the coaxial tubes together on the other end and also acts as a high voltage vacuum feedthrough. The long and narrow channel between the coaxial tubes provide a superior shield against condensable vapor and sputtered material to build-up on the high voltage insulator and also the gap acts as a protective spark gap before sparks develop within the insulator.

According to another exemplary aspect of the invention, an ion implantation system comprises an ion beam source including an extraction electrode manipulator system wherein the ion beam source defines an extraction electrode and the extraction electrode defines an aperture and is configured to extract ions from the ion source. Inner tube of two coaxially mounted cold water support tubes system support a suppression electrode. A ground electrode is supported by an outer water cooled support tube. An insulating standoff wherein the insulating standoff is deposed between outer water cooled support tube flange and inner water cooled support tube flange on the other end of long coaxial line and also acts as a high voltage vacuum feedthrough. A beam line assembly receives the ion beam from the source comprising a mass analyzer that selectively passes selected ions and an end station that receives the ion beam from the beam line assembly.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
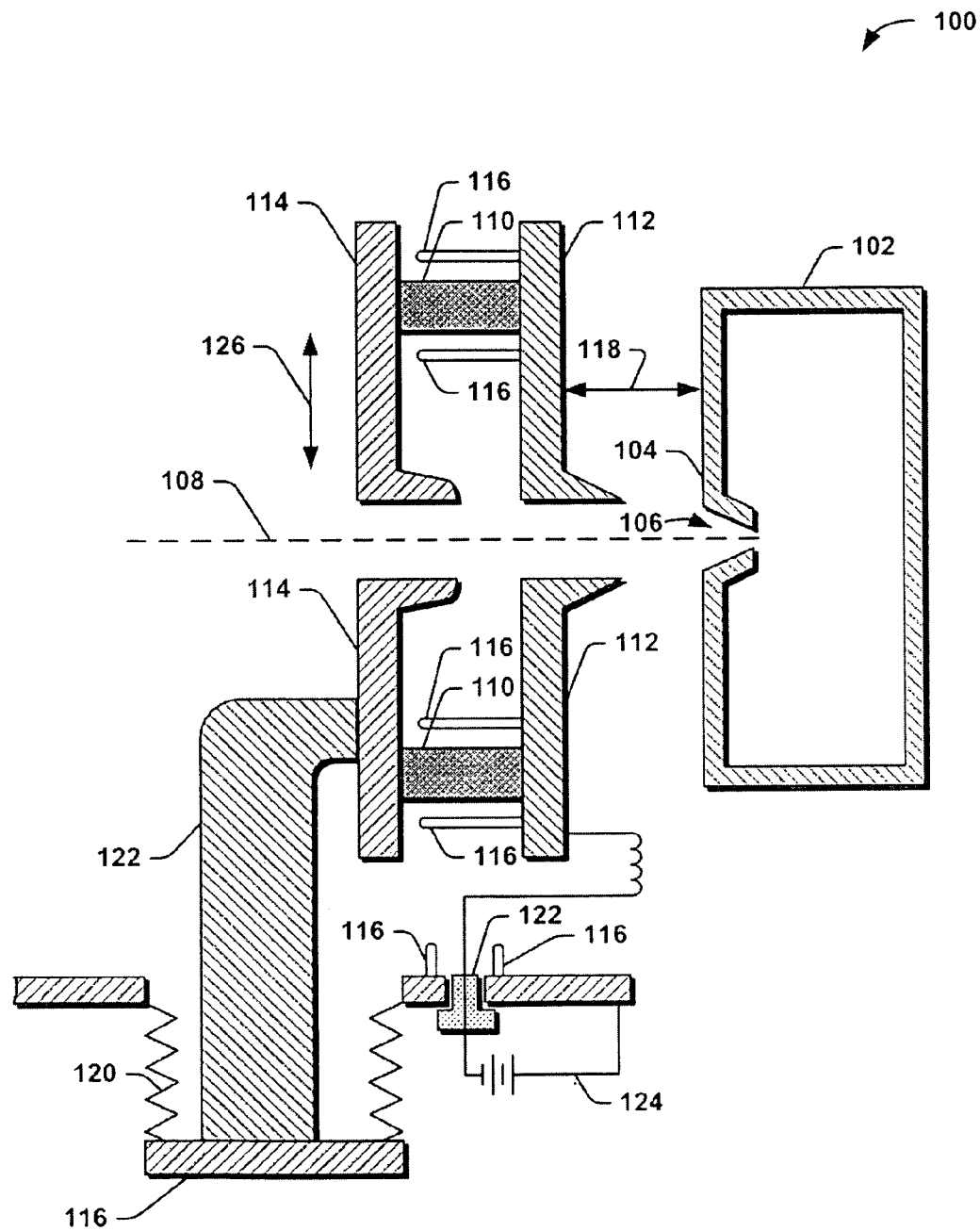
FIG. 1 illustrates a prior art cross-sectional view of an extraction electrode apparatus.

The present invention is directed generally towards an improved extraction manipulator system and method used in an ion implantation system that utilizes an isolated insulation standoff. More particularly, the system and method efficiently extract an ion beam utilized in the ion implantation system with less frequent maintenance of the insulating standoff. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
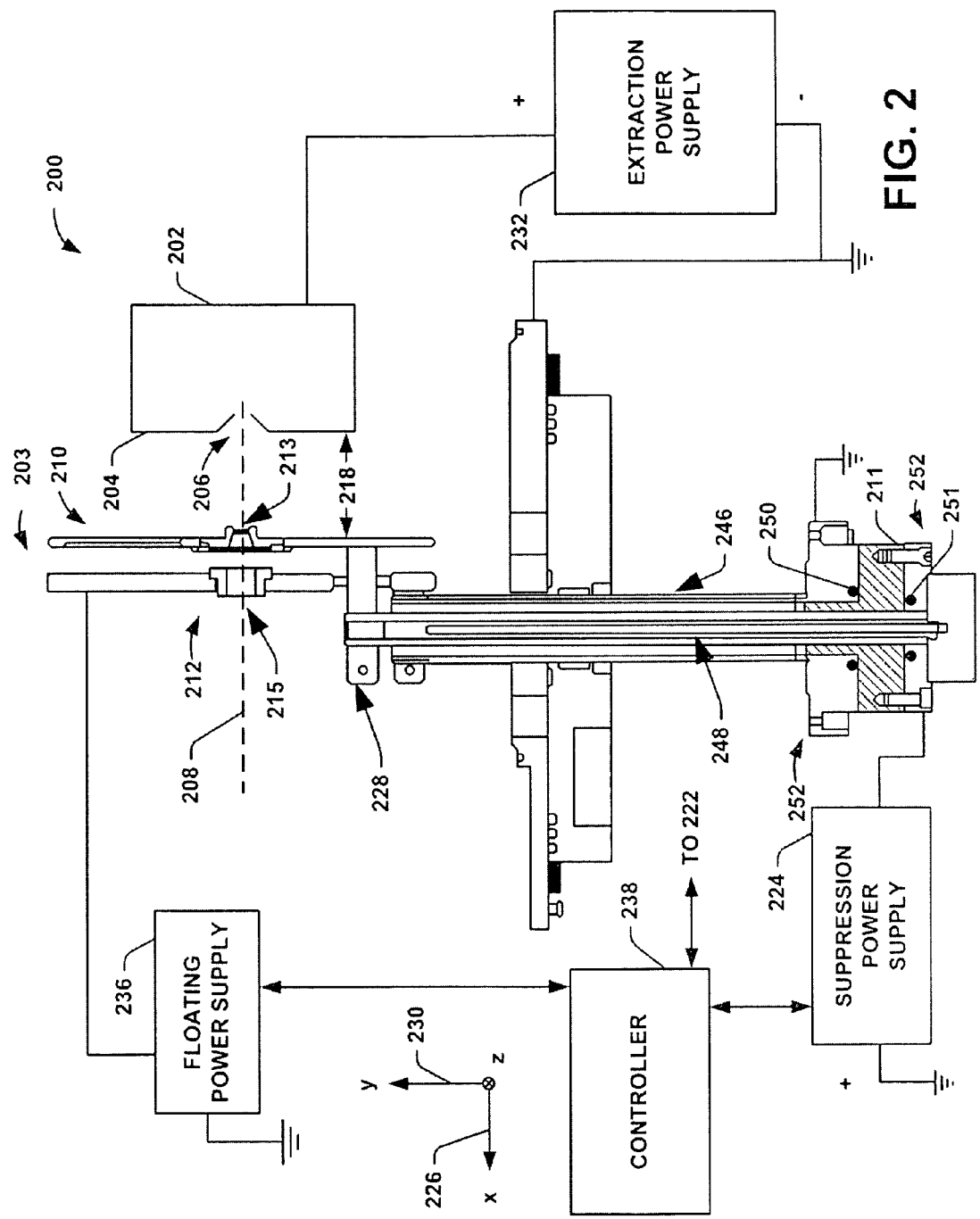
FIG. 2 illustrates a cross-sectional view of an extraction electrode manipulator according to one embodiment of the present invention.

Turning now to FIG. 2, the drawing illustrates, in a simplified cross-sectional schematic illustration of certain components of an exemplary extraction electrode manipulator system 200 wherein one or more aspects of the present invention are implemented. The system 200 is illustrated as producing an ion beam 208 in the range of 1 to 100 keV, for example, however one skilled in the art would recognize many other electrode insulator arrangements that can be utilized. The system 200 includes an ion source 202 comprising an ion source front plate 204, and an exit slit 206. As is well known by those of skill in the art, the ion source 202, for example, can comprise an plasma generating component, a cathode, a filament, an anode, a repeller, a gas supply, source magnet components, and an ion extraction/suppression) electrode assembly.

The ion beam 208 (e.g., simply illustrated as a single dashed line) is extracted from the ion source 202 by an electrode 204 since the ion source 202 is usually biased positively (for extracting positive ions) by an extraction power supply at 0.5 to 100 KV above the entire manipulator system. The suppression electrode 210 is also biased negatively with respect to the ground electrode 212 and the entire manipulator by several KV, thereby repelling any electrons which would otherwise be accelerated toward the positively biased ion source 202. The ion beam 208 is extracted out of an exit slit 206. Further on in the positive x direction 226, the beam 208 encounters a ground electrode 212. In one or more embodiments a gap 218 between the ion source 202 and the movable suppression electrode 210 and ground electrode 212, can be adjusted.

In this embodiment the size of the gap 218 can be increased for higher energy beams and decreased for lower energy beams, for example. The source aperture 206 is adjustably spaced from the suppression electrode 210 having a suppression electrode aperture 213, by a distance referred to as the extraction gap 218, as discussed supra. The suppression electrode 210 and the ground electrode 212 can each further comprise two or more separate plates (for example), for adjusting a variable suppression 213 and ground aperture 215, also known by those of skill in the art as variable aperture electrode (VAE). The ground electrode 212 having the ground electrode aperture 215 formed therein, is positioned on the other side of the suppression electrode 210, as illustrated, and can be fixedly spaced from the suppression electrode 210, for example.

Both the suppression electrode 210 and the ground electrode 212 can be adjusted by a mechanical motion manipulator 228 so that the apertures 213 and 215 can be aligned to the source aperture 206 in the y-direction 230. In the alternative, the source aperture 206 and suppression aperture 313 can only be aligned during setup. However, it is to be appreciated by one skilled in the art that the mechanical motion manipulator 228 can be utilized as an active control over all of the apertures in the y-axis direction 230.

The source aperture 206, the suppression electrode 210 and the ground electrode 212 are electrically insulated from each other and each is connected to a separate voltage sources 232, 234 and 236, respectively. Each of the voltage sources 232, 234 and 236 and a controller 238 are connected to a central processor which generates control signals for controlling the potential on each of the electrodes 204, 210 and 212, the ion source arc chamber, and the gap 218. Thus, the measured ion quality, for example, divergence and beam transmission, can be used in a feedback loop to control parameters in ion generation, such as: the gap 218, aperture (213 and 215) alignment, the potential applied to the electrodes (204, 210 and 212), etc. A processor can generate a control signal for controlling the ion beam extraction parameters depending on the measured beam divergence, for example.

The ground electrode 212 and suppression electrode 210 are supported by coaxially arranged water cooled support tubes, 246 and 248. On the other end of the coaxially arranged support tubes is a high voltage insulator ring 211 which acts as mechanical support of the inner support tube 248 against the outer support tube 246, but also as a high voltage vacuum feedthrough, The long and narrow space between the two coaxial tubes helps to greatly reduce the chance of contamination and coating vapor to reach the insulating surface of the insulator ring 211. The long and narrow gap between the coaxial tubes also acts as a protective spark gap which triggers before an electric field within the insulator ring, 211, reaches a dangerous level to spark within the insulating material.

The two support tubes, 246 and 248, are water cooled to minimize the effect of thermal expansion of the tube length, which may affect the relative alignment of the two electrodes, ground electrode 212 and suppression electrode 213.

Figure 3:
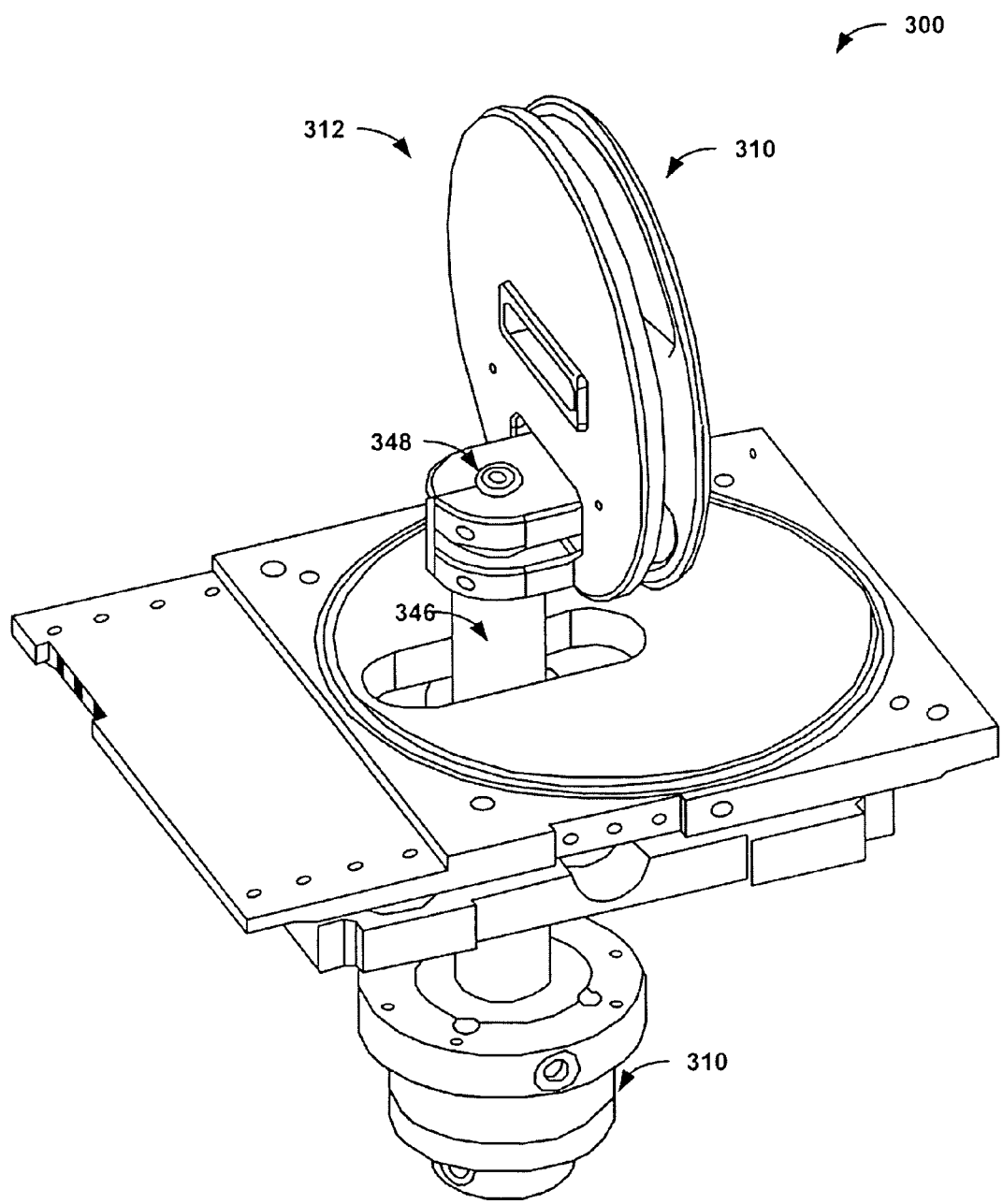
FIG. 3 illustrates a perspective view of an extraction electrode manipulator according to another embodiment of the present invention.

As illustrated in FIG. 3, the ground electrode 312 and suppression electrode 310 are supported by coaxially arranged water cooled support tubes 346 and 348. The support tubes 346 and 348 sandwich the insulating standoff 310 with o-rings 250 and 251 between the insulator ring 310 and the support tubes 246 and 248 to prevent contaminants from coating the insulating support 311.

The inventors recognized that a key aspect of this invention is that the high voltage insulator ring 211 is outside of the extraction electrode manipulator support envelop. The approach illustrated in FIG. 3 is a better approach with regard to protecting the insulator than the approach illustrated in prior art FIG. 1 and other known systems.

Figure 4:
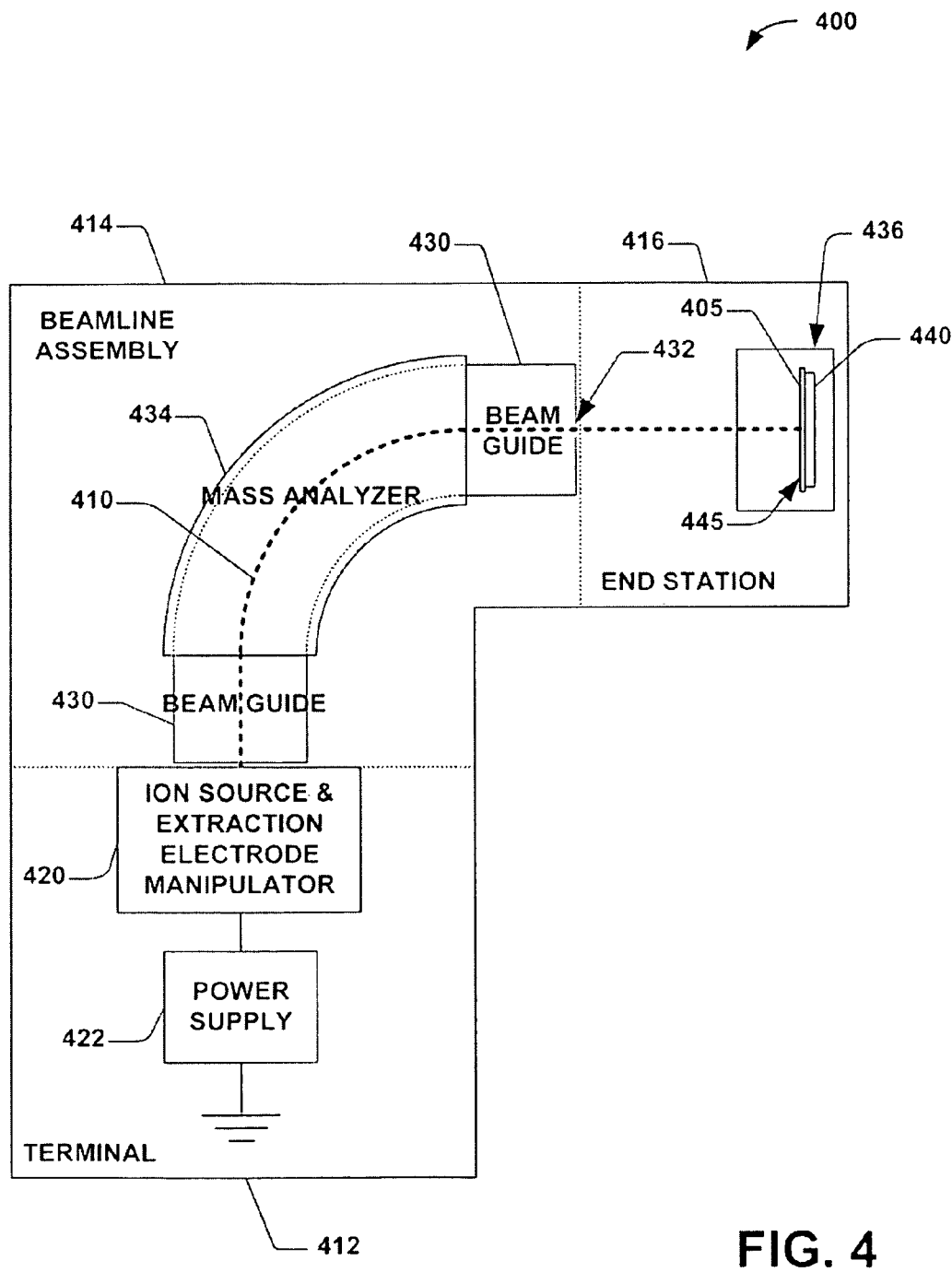
FIG. 4 illustrates an ion implantation system according to an embodiment of the present invention.

FIG. 4 illustrates an exemplary ion implantation system 400, wherein the system 400 can be operable to scan an ion beam 410 in a single scan or multiple scans of the substrate 405. As stated above, various aspects of the present invention may be implemented in association with any type of ion implantation system, including, but not limited to, the exemplary system 400 of FIG. 4. The exemplary ion implantation system 400 comprises a terminal 412, a beamline assembly 414, and an end station 416 that form a process chamber 436 in which the ion beam 410 is directed to a workpiece location 445. An ion source 420 in the terminal 412 is powered by a power supply 422 to provide an extracted ion beam 410 to the beamline assembly 414, wherein the source 420 comprises one or more extraction electrodes (not shown) to extract ions from the source chamber and thereby to direct the extracted ion beam 410 toward the beamline assembly 414. The extraction electrode manipulator 200 was discussed previously in detail.

The beamline assembly 414, for example, can comprise a beamguide 430 having an entrance near the source 420 and an exit with a resolving aperture 432, as well as a mass analyzer 434 that receives the extracted ion beam 410 and creates a dipole magnetic field to pass only ions of appropriate momentum or range thereof (e.g., a mass analyzed ion beam 410 having ions of a desired mass range) through the resolving aperture 432. The scan system scans the broad ion beam 410 across the workpiece 405, for example and may be an electrostatic system, a magnetic system, a mechanical system, and the like. The beam 410 can then be delivered to the substrate 405 on a workpiece scanning system 436 associated with the end station 416. Various beam forming and shaping structures (not shown) associated with the beamline assembly 414 may be further provided, for example to maintain and bound the broad ion beam 410 when the ion beam 410 is transported along a beam path to the substrate 405 supported on the workpiece scanning system 436.

The ion beam 410 then enters the beamline assembly 414 and an associated analyzer magnet 434. The mass analysis magnet 434 can be formed at about a ninety degree angle and a magnetic field is generated therein. As the ion beam 410 enters the magnet 434, it is correspondingly bent by the magnetic field such that ions of an inappropriate charge-to-mass ratio are rejected. More particularly, ions having too great or too small of a charge-to-mass ratio are deflected into side walls of the magnet 434. In this manner, the magnet 434 only allows those ions to remain in the beam 410 which have the desired charge-to-mass ratio to completely traverse therethrough.

The control electronics or the controller 238 (FIG. 2) can adjust the strength and orientation of the magnetic field, among other properties. The magnetic field can, for example, be controlled by regulating the amount of electrical current running through field windings of the magnet 434. It will be appreciated that the controller 238 may include a programmable micro-controller, processor and/or other type of computing mechanism for overall control of the system 400 (e.g., by an operator, by previously and/or presently acquired data and/or programs).

The beamline assembly 414 may also include an accelerator/decelerator, for example, that comprises a plurality of electrodes arranged and biased to accelerate and/or decelerate ions, as well as to focus, bend and/or decontaminate the ion beam 410. The electrodes can decontaminate the beam 410 by bending the beam 410 and separating out contaminating particles from the beam 410, in a manner discussed in further detail below.

Further, it will be appreciated that ion beam collisions with other particles degrade beam integrity, so that an entire beamline assembly 414, from the source 402 to the end station 416, may be evacuated by one or more pumps (not shown). Downstream of the accelerator/decelerator is the end station 416 which receives the mass analyzed ion beam 410 from the beamline assembly 414. The end station 416 includes a scanning system 436 that may comprise a support or end effector 440 upon which a workpiece 405 is mounted for selective movement thereby. The end effector 440 and the workpiece 405 reside in a target plane that is generally perpendicular (i.e., the xz plane) to the negative y direction of the ion beam 410.

It will be appreciated that the beam current may be affected by many of the components of the system 400. For example, respective biases on the extraction electrode 304, the suppression electrode 310 and the ground electrode 312 can affect the beam current. Accordingly, the beam current can be modulated by selectively controlling one or more of the extraction and the suppression voltage supplies, 332 and 334, respectively. It will be appreciated that while a combined set of the extraction electrode 304 and the suppression electrode 310 are discussed herein, the present invention contemplates separate sets of the extraction electrode 304 and suppression 310 electrodes having respective supplies that can be independently varied to alter the respective voltages applied to those electrodes. It will be further appreciated that the ground electrode 312 is generally modulated with a voltage different from the other electrodes 304 and 312, equal to or different from the ground potential.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An extraction electrode manipulator system, comprising:
    a suppression electrode;
        wherein the suppression electrode is supported by an inner support tube of a coaxially arranged support tube system;
    a ground electrode;
        wherein the ground electrode is supported by an outer support tube of the coaxially arranged support tube system; and
    a high voltage insulator ring;
        wherein the high voltage insulating ring is located on the far end of the coaxially arranged support tube system and acts as mechanical support of the coaxial support system and also as a high voltage vacuum feedthrough.

2. The system of claim 1, wherein both the support tubes in the coaxially arranged support system are water cooled to minimize thermal expansion.

3. The system of claim 1, wherein one high voltage insulator acts
    as a mechanical support of an electrode and also as a high voltage vacuum feedthrough.

4. The system of claim 1, wherein the insulator ring is made of a material comprising ceramic and plastic.

5. The system of claim 1, wherein the inner support tube is made of a material comprising stainless steel, aluminum, molybdenum and refractory metals.

6. The system of claim 1, wherein the outer support tube is made of a material comprising stainless steel, aluminum, molybdenum and refractory metals.

7. The system of claim 1, wherein both support tubes in the coaxially arranged support system are water cooled to minimize thermal expansion.

8. The system of claim 7 wherein one high voltage insulating standoff acts as a mechanical support of an electrode and also as a high voltage vacuum feedthrough.

9. The system of claim 1, wherein the insulator ring is cylindrical with a center opening for the inner water cooled support tube to pass through the insulating standoff.

10. The system of claim 1, wherein the insulator ring is made of a material comprising ceramic.

11. The system of claim 1, wherein the inner support tube is made of a material comprising stainless steel, aluminum, molybdenum and refractory metals.

12. The system of claim 1, wherein the outer support tube is made of a material comprising stainless steel, aluminum, molybdenum and refractory metals.

13. An ion implantation system, comprising:
    an ion beam source comprising an extraction electrode manipulator system;
    a suppression electrode;
        wherein the suppression electrode is supported by an inner support tube of coaxially arranged support tube system;
    a ground electrode;
        wherein the ground electrode is supported by an outer support tube of coaxially arranged support tube system;
    a high voltage insulator ring; and
    wherein the high voltage insulator ring is located on the far end of coaxially arranged support tube system and acts as mechanical support of the coaxial support system and also as a high voltage vacuum feedthrough;
    a beam line assembly receives an ion beam from the source comprising;
    a mass analyzer that selectively passes selected ions; and
    an end station that receives the ion beam from the beam line assembly.

14. An extraction electrode manipulator system, comprising:
    a coaxially arranged support tube system comprising an inner tube and an outer tube, the support tube system comprising a first end and a second end;
    a suppression electrode connected to the first end of one of the inner tube and the outer tube, and a ground electrode connected to the first end of the other of the inner tube and the outer tube; and
    an insulator ring located at the second end of the support tube system, and configured to mechanically support the support tube system.

15. The system of claim 14, further comprising a controller configured to independently control the inner and outer tubes of the coaxially arranged support tube system, thereby altering a vertical position of an aperture of either the suppression electrode or the ground electrode, or both, with respect to an ion beam.

16. The system of claim 15, wherein the controller is further configured to control a lateral position of both the suppression electrode and the ground electrode with respect to an ion source, thereby altering a gap between the suppression electrode and the ground electrode arrangement and the ion source.

17. The system of claim 16, wherein the controller is configured to control the lateral positioning of the suppression electrode and the ground electrode as a function of an ion beam energy.

18. The system of claim 16, wherein the controller is configured to receive data reflecting an ion beam quality, and generate one or more control signals to alter the vertical position of either the suppression electrode or the ground electrode, or both, and/or the lateral positioning of the suppression electrode and the ground electrode in response thereto.

19. The system of claim 15, wherein the controller is configured to receive data reflecting an ion beam quality, and generate one or more control signals to alter the vertical position of either the suppression electrode or the ground electrode, or both.

20. The system of claim 14, wherein one or both of the inner tube and the outer tube comprise a water cooled support tube.

* * * * *